US008975004B2

(12) United States Patent  
Choi et al.

(10) Patent No.: US 8,975,004 B2
(45) Date of Patent: Mar. 10, 2015

(54) ELECTRICALLY CONDUCTIVE POLYMER RESIN AND METHOD FOR MAKING SAME

(75) Inventors: Jeongwan Choi, Suwon-Si (KR); Un Nyoung Sa, Gyongki-Do (KR); Won-Sik Kim, Hwasong (KR)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/913,690

(22) PCT Filed: May 15, 2006

(86) PCT No.: PCT/US2006/018584
§ 371 (c)(1),
(2), (4) Date: Nov. 6, 2007

(87) PCT Pub. No.: WO2006/124694
PCT Pub. Date: Nov. 23, 2006

(65) Prior Publication Data
US 2008/0149901 A1    Jun. 26, 2008

(30) Foreign Application Priority Data
May 13, 2005    (KR) .................. 10-2005-0040155

(51) Int. Cl.
| | |
|---|---|
| G03F 7/00 | (2006.01) |
| H01L 21/00 | (2006.01) |
| H01B 1/00 | (2006.01) |
| H05K 9/00 | (2006.01) |
| C08F 2/44 | (2006.01) |
| C08F 2/48 | (2006.01) |
| C08L 101/12 | (2006.01) |
| H01B 1/22 | (2006.01) |

(52) U.S. Cl.
CPC ............. *H05K 9/0083* (2013.01); *C08F 2/44* (2013.01); *C08F 2/48* (2013.01); *C08L 101/12* (2013.01); *H01B 1/22* (2013.01)
USPC ............ 430/311; 430/313; 430/315; 252/500

(58) Field of Classification Search
USPC ........... 252/500; 428/323; 525/513, 512, 514, 525/500; 430/311, 313, 315
See application file for complete search history.

(56) References Cited

U.S. PATENT DOCUMENTS

| | | | |
|---|---|---|---|
| 4,078,160 A | | 3/1978 | Bost |
| 4,288,081 A | | 9/1981 | Sado |
| 4,448,837 A | | 5/1984 | Ikeda et al. |
| 4,546,037 A | * | 10/1985 | King ............................. 428/323 |
| 4,548,862 A | * | 10/1985 | Hartman ....................... 428/323 |
| 4,731,282 A | | 3/1988 | Tsukagoshi et al. |
| 5,443,876 A | | 8/1995 | Koskenmaki et al. |
| 5,447,824 A | * | 9/1995 | Mutsaers et al. .............. 430/315 |
| 5,522,962 A | | 6/1996 | Koskenmaki et al. |
| 6,149,857 A | * | 11/2000 | McArdle et al. .............. 264/429 |
| 6,548,175 B2 | | 4/2003 | Sachdev et al. |
| 6,591,496 B2 | | 7/2003 | Koskenmaki et al. |
| 6,784,363 B2 | | 8/2004 | Jones |
| 6,929,849 B2 | | 8/2005 | Koskenmaki et al. |
| 7,034,403 B2 | | 4/2006 | Divigalpitiya et al. |
| 7,404,997 B2 | * | 7/2008 | Emslander et al. ........ 428/195.1 |
| 7,504,191 B2 | | 3/2009 | Kondo et al. |
| 2005/0152577 A1 | | 7/2005 | Nishimura et al. |
| 2005/0192392 A1 | | 9/2005 | Kim et al. |
| 2006/0083948 A1 | | 4/2006 | Kawaguchi |
| 2007/0001292 A1 | | 1/2007 | Ohta et al. |
| 2007/0068622 A1 | | 3/2007 | Konishi |
| 2008/0124521 A1 | | 5/2008 | Niino |
| 2009/0169852 A1 | | 7/2009 | Choi et al. |
| 2009/0291608 A1 | | 11/2009 | Choi et al. |
| 2010/0317759 A1 | | 12/2010 | Ryu et al. |

FOREIGN PATENT DOCUMENTS

| | | |
|---|---|---|
| JP | HEI 9-000816 | 1/1997 |
| JP | 11-323275 | 11/1999 |
| JP | 2000-077891 | 3/2000 |
| JP | 2005-344068 | 12/2005 |
| KR | 2004-0046543 | 6/2004 |
| KR | 2004-0103067 | 12/2004 |
| KR | 2005-0042419 | 5/2005 |
| WO | 2006-093315 | 9/2006 |
| WO | WO 2006/124694 A1 | 11/2006 |
| WO | WO 2009-085631 | 7/2009 |

OTHER PUBLICATIONS

Callen, Brian W. et al., "Practical consideration for loading conductive fillers into shielding elastomers", ITEM 2002, www.rbitem.com.

* cited by examiner

*Primary Examiner* — Monique Peets

(57) ABSTRACT

Disclosed are polymer resins, including polymer resin sheets, having good electroconductivity and a method for manufacturing the same. The polymer resins exhibit flexibility and show electroconductivity on their surface as well as along their thickness, and thus can be used as electromagnetic wave-shielding materials having impact- and vibration-absorbing properties as well as conductivity.

7 Claims, 4 Drawing Sheets

ELECTRICALLY CONDUCTIVE POLYMER RESIN AND METHOD FOR MAKING SAME

CROSS REFERENCE TO RELATED APPLICATIONS

This application is a national stage filing under 35 U.S.C. 371 of PCT/US2006/018584, filed May 15, 2006, which claims priority to Korean Application No. 10-2005-0040155, filed May 13, 2005, the disclosure of which is incorporated by reference in its/their entirety herein.

TECHNICAL FIELD

The present invention relates to an electrically conductive polymer resin and to a method for manufacturing the same. More particularly, the present invention relates to an adhesive polymer sheet that has flexibility and shows electroconductivity on its surface as well as along its thickness direction, and thus can be used as electromagnetic wave-shielding sheet having impact- and vibration-absorbing properties as well as conductivity. The present invention also relates to a method for manufacturing the above adhesive polymer sheet.

BACKGROUND

Various harmful electron waves and electromagnetic waves generated in circuits of electronic instruments may disturb the function of peripheral electronic parts or devices, deteriorate performance, produce noise, degrade images, decrease their service life, and thus result in production of inferior products. In order to protect sensitive electronic equipment from such electron waves and electromagnetic waves, various electron wave- and electromagnetic wave-shielding materials have been developed. For example, a variety of metal plates, metal coated fabrics, conductive paints, conductive tapes or conductivity-imparted polymer elastomers have been suggested.

In general, the following methods have been used in order to impart conductivity to polymer elastomer resins.

For example, during the production of polymer elastomer resins, finely divided conductive powder or filler such as common carbon black, graphite, silver, copper, nickel or aluminum is dispersed uniformly in the resins. In order to impart conductivity to the polymer elastomer resins, it is necessary to form a pathway of interconnecting filler particles in the polymer resin. In other words, metal particles or carbon black particles should be in a close contact state so that the conductive particles permit passage of electrons.

For example, when carbon black particles are blended with urethane resins to impart conductivity in some applications, 15-30 wt % of carbon black particles are used based on the weight of the resins. However, 40 wt % or more of carbon black particles may be desired in order to obtain improved conductivity. Introduction of carbon black particles in such a large amount makes it difficult to disperse the particles uniformly, and reduces melt viscoelasticity of resins, resulting in agglomeration of filler particles and a significant increase in viscosity. When metal powder is used, it is blended with resins in an amount of 2-3 times by weight of the corresponding amount of carbon black in order to obtain electroconductivity. In this case, dispersibility becomes poor and specific gravity increases.

In brief, according to the above-described method of introducing conductive filler to polymer resins, it has been difficult to obtain polymer resins exhibiting acceptable electroconductivity as well as impact- and vibration-protecting properties.

According to another conventional method, electron wave- and electromagnetic wave-shielding material is obtained by coating various fabrics, non-woven webs, paper or other plastic films with a coating agent comprising a conductive agent. Such materials include metal plated fabrics and conductive tapes. However, because such materials lack volumetric conductivity, they are merely used in applications requiring surface conductivity.

Further, according to still another conventional method, in order to impart a silicone sheet with conductivity, an excessive amount (70 wt % or more) of filler is used in the silicone sheet. However, the method is not cost-efficient due to the high cost needed for such a large amount of filler.

Particular examples of approaches to imparting conductivity to polymer resins or elastomers include: Japanese Laid-Open Patent No. Hei 9-000816; Japanese Laid-Open Patent No. 2000-077891; U.S. Pat. No. 6,768,524; U.S. Pat. No. 6,784,363; and U.S. Pat. No. 4,548,862.

However, the above-mentioned methods according to the prior art have disadvantages in that they need a separate step of adhesive-treatment or they have to use additional adhesives for example, double-sided adhesive tapes.

SUMMARY

According to one exemplary embodiment of the present invention, there is provided a polymer resin having electroconductivity on its surface as well as along its thickness direction.

More particularly, in one embodiment, the present invention provides a polymer resin comprising a polymer component and a conductive filler distributed in the polymer component. The polymer resin may be a sheet-like resin, wherein the sheet includes a section where the conductive filler is arrayed in the thickness direction of the sheet and another section where the conductive filler is arrayed in the horizontal direction of the sheet, so that such array along the thickness direction and horizontal direction permits the filler present in the sheet to be interconnected from one surface of the sheet to the other surface of the sheet.

As used herein, the "polymer component" is referred to as a polymer formed by polymerization of monomers, which is the part other than the filler or additives in the polymer resin.

The polymer component forming the polymer resin may be a photopolymerizable polymer. In one exemplary embodiment, the polymer component is an acrylic polymer, and may be a photopolymerizable acrylic polymer that can be produced by photopolymerization. In another exemplary embodiment, the polymer resin according to the present invention can be used as adhesive due to its adhesive property.

The polymer resin may take the form of a sheet or adhesive sheet. If desired, the polymer resin may take the form of an adhesive tape. According to an exemplary embodiment of the present invention, the polymer resin is a polymer sheet having electric conductivity, and may be an adhesive polymer sheet having electric conductivity.

The polymer resin according to the present invention comprises a conductive filler. In the exemplary embodiment shown in FIGS. 2a-2c, the conductive filler is arrayed in the horizontal and vertical directions of the polymer resin to form a network structure through which electric current can pass.

In an exemplary embodiment of the polymer resin according to the present invention, the polymer component and the filler are present in an amount of 10-95 wt % and 5-90 wt %, respectively, based on the total weight of the polymer resin. In another exemplary embodiment, the polymer component and the filler are present in an amount of 40-80 wt % and 20-60 wt %, respectively, based on the total weight of the polymer resin.

According to an exemplary embodiment of the present invention, the conductive filler is arrayed along the vertical direction as well as the horizontal direction of the polymer resin. To accomplish this, moving characteristics of the filler is utilized during a polymerization process. Particularly, a conductive filler is added to a polymer composition of a syrup-like state where monomers are not cured completely (also referred to as "polymer syrup," hereinafter) and then the resultant polymer syrup is subjected to photopolymerization by light irradiation. More particularly, when the polymer syrup is irradiated for the purpose of photopolymerization, if the irradiation is controlled selectively to the surface of the polymer syrup, the photopolymerization can initiate selectively on the surface and thus the filler can be arrayed in a desired pattern.

In order to initiate such selective photopolymerization, a mask, such as a release liner having a desired pattern, may be used. The release liner is made of a light transmittable material and has a predetermined section where light transmission is sufficiently reduced or is not permitted so that photopolymerization is sufficiently reduced or cannot be initiated directly under the section.

Thus, according to another aspect of the present invention, there is provided a method for manufacturing a polymer resin having electroconductivity on its surface direction as well as along its thickness direction. More particularly, in the method for manufacturing a polymer resin, monomers for producing the polymer are mixed with a conductive filler, and then the mixture is irradiated with light to perform photopolymerization, wherein only a selective part of the surface of the mixture is irradiated with light.

In the above method, the monomers for producing the polymer may be partially polymerized before adding the conductive polymer in order to disperse the conductive filler uniformly in the composition for manufacturing the polymer resin.

Therefore, the present invention provides in one exemplary embodiment a method for manufacturing a polymer resin, which comprises the steps of:

forming polymer syrup by partial polymerization of monomers for producing the polymer;

adding a conductive filler to the syrup and mixing them substantially homogeneously;

applying a release liner having a desired masking pattern onto the surface of the syrup containing the conductive filler added thereto; and irradiating the syrup through the release liner with light to perform photopolymerization.

Additionally, the present invention provides a method for arraying filler in a polymer resin prepared by a photopolymerization process, which comprises a step of irradiating a mixture containing monomers for producing the polymer resin and the filler with light to perform photopolymerization, wherein only a part of the mixture is irradiated with light so that the filler can be arrayed in a desired pattern in the polymer resin.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION

Figure 1:
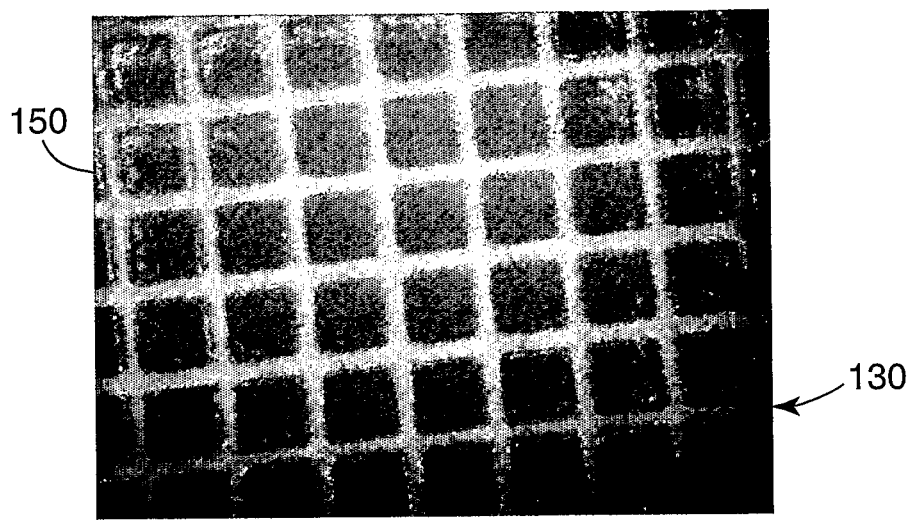
FIG. 1 is a picture showing the appearance of a polyacrylic resin sheet according to an exemplary embodiment of the present invention.

Hereinafter, the present invention will be explained in more detail.

FIG. 2 shows a schematic representation of a polymer resin 100 according to an exemplary embodiment of the present invention. The polymer resin may be in the form of a sheet having a thickness, t, in the z-axis direction. The polymer resin sheet of the current invention is composed of a polymer component 110 and a conductive filler 120 distributed in the polymer component. The polymer resin sheet includes a section 130 where the conductive filler is arrayed in the thickness direction of the sheet and another section 140 where the conductive filler is arrayed in the horizontal direction of the sheet, so that such array along the thickness direction and horizontal direction permits the filler present in the sheet to be interconnected from one surface of the sheet to the other surface of the sheet and also along the length and width of the sheet. When the conductive filler is arrayed in this horizontal and vertical directions within the polymer resin a network is formed through which electric current can pass. This conductive network provides for electrical conductivity through the resin sheet as well as along its length and width.

The conductive sections 130 of the sheet that extend through the thickness of the sheet can be formed to have a desired pattern (i.e., a grid, see FIG. 1). FIG. 1 shows a grid of conductive sections 130 that extend vertically through the polymer resin sheet and areas 150 of the polymer that are substantially free of conductive particles. Because areas 150 are essentially free of conductive particles, the properties of the polymer component (e.g., adhesion, vibration absorption, impact properties, etc.) dominate. This is especially useful if the polymer component is a pressure sensitive adhesive, since it is known that highly loaded pressure sensitive adhesives have lower adhesion than a the same pressure sensitive adhesive having no filler. Thus by having areas 150 that are essentially particle free the adhesive properties of the inventive resin sheet are retained.

In the polymer resin according to an exemplary embodiment of the present invention, the polymer component is a polymer that can be produced by polymerization of photopolymerizable monomers. In another embodiment, photopolymerizable acrylic polymers may be used.

One exemplary embodiment of making the polymer resin includes the steps of mixing photopolymerizable monomers with polar copolymerizable monomers; carrying out a prepolymerization of the resultant mixture to form photopolymerizable polymer syrup having a viscosity of about 500-20,000 cps; adding a conductive filler to the polymer syrup; and carrying out selective polymerization of the polymer syrup by using a release liner having a desired pattern. According to the above method, it is possible to obtain a polymer resin having a network of conductive filler. In an alternative embodiment, a monomer mixture may be thickened sufficiently to form a syrup using thixotropic materials such as silica.

The photopolymerizable monomer that may be used in the polymer resin according to the present invention includes an alkyl acrylate monomer (including alkyl methacrylate monomer) whose alkyl group has 1-14 carbon atoms.

Non-limiting examples of the alkyl acrylate monomer include butyl(meth)acrylate, hexyl(meth)acrylate, n-octyl (meth)acrylate, isooctyl(meth)acrylate, 2-ethylhexyl(meth) acrylate, isononyl(meth)acrylate, etc. Additionally, as the alkyl acrylate monomer, isooctyl acrylate, isononyl acrylate, 2-ethylhexyl acrylate, decyl acrylate, dodecyl acrylate, n-butyl acrylate, hexyl acrylate, etc. may be used. In another embodiment, isooctyl acrylate, isononyl acrylate or butyl acrylate may be used.

Such alkyl acrylate monomers can form photopolymerizable polymer syrup by partial polymerization thereof. Alternatively, the photopolymerizable polymer syrup can be formed by copolymerization of the alkyl acrylate monomers with polar copolymerizable monomers. Although there is no particular limitation in the mixing ratio of the alkyl acrylate monomer to the polar copolymerizable monomer, in one embodiment, they are used in a weight ratio of 99~50:1~50.

The polar copolymerizable monomer that may be used includes highly polar monomers and moderately polar monomers. When the alkyl acrylate monomer is copolymerized with a highly polar monomer, the alkyl acrylate monomer is used in one embodiment in an amount of 75 wt % or more based on the weight of the photopolymerizable polymer syrup. In another embodiment, the alkyl acrylate is used in an amount of 50 wt % or more based on the weight of the photopolymerizable polymer syrup.

Non-limiting examples of the highly polar monomer include acrylic acid, itaconic acid, hydroxyalkyl acrylates, cyanoalkyl acrylates, acrylamides or substituted acrylamides. Meanwhile, non-limiting examples of the moderately polar monomer include N-vinyl pyrrolidone, N-vinyl caprolactam, acrylonitrile, vinyl chloride or diallyl phthalate.

The highly polar copolymerizable monomer is used in an amount of 25 wt % or less, an in one embodiment in an amount of 15 wt % or less, based on the weight of the photopolymerizable polymer syrup. The moderately polar copolymerizable monomer is used in an amount of 50 wt % or less, and in one embodiment in an amount of between 5 and 30 wt %, based on the weight of the photopolymerizable polymer syrup. Such polar copolymerizable monomers serve to impart adhesive property and cohesive force to the polymer resin according to the present invention and to improve adhesion force.

The polymer resin according to the present invention includes a conductive filler for imparting electroconductivity. Although there is no particular limitation in kind of the conductive filler, the conductive filler that may be used includes noble metals; non-noble metals; noble metal-plated noble and non-noble metals; non-noble metal-plated noble and non-noble metals; noble and non-noble metal-plated non-metals; conductive non-metals; and mixtures thereof. More particularly, the conductive filler may include or comprise noble metals such as gold, silver and platinum; non-noble metals such as nickel, copper, tin and aluminum; noble metal-plated noble and non-noble metals such as silver-plated copper, nickel, aluminum, tin and gold; non-noble metal-plated noble and non-noble metals such as nickel-plated copper and silver; noble and non-noble metal-plated non-metals such as silver- or nickel-plated graphite, glass, ceramics, plastics, elastomers and mica; conductive non-metals such as carbon black and carbon fiber; and mixtures thereof.

The filler may broadly be classified as "particulate" in form, although the particular shape of such form is not considered critical to the present invention and may include, for example, any shape that is conventionally involved in the manufacture or formation of conductive materials of the type described herein. Such shapes include, for example, hollow or solid microspheres, elastomeric balloons, flakes, platelets, fibers, rods, irregularly-shaped particles, or a mixture thereof. Similarly, the particle size of the filler material is also not considered critical, and may be within a narrow or broad distribution range. In one exemplary embodiment of the invention, the particle size may be within a range of between about 0.250 and 250 µm and in another embodiment between about 1 and 100 µm.

The polymer component and the filler are present in the conductive polymer resin according to the present invention, in an amount of 10-95 wt % and 5-90 wt %, respectively, based on the total weight of the polymer resin. In another embodiment, the polymer component and the filler are present in the conductive polymer resin according to the present invention, in an amount of 40-80 wt % and 20-60 wt %, respectively, based on the total weight of the polymer resin.

Additionally, to provide physical properties required for a particular product to which the polymer resin is applied, the polymer resin according to the present invention may further include at least one additional filler other than the above conductive filler. There is no particular limitation in the kind of the additional filler as long as it does not adversely affect the characteristics and utility of the polymer resin. However, non-limiting examples of the additional filler includes heat conductive fillers, flame resistant fillers, anti-static agents, foaming agents, polymeric hollow microspheres, etc.

According to the present invention, the additional filler may be used in an amount of less than 100 parts by weight based on 100 parts by weight of the polymer component.

In addition, the polymer resin according to the present invention may further comprise other additives including a polymerization initiator, crosslinking agent, photoinitiator, pigment, antioxidant, UV stabilizer, dispersant, antifoaming agent, thickening agent, plasticizer, tackifying resin, silane coupling agent, brightening agent, or the like.

Hereinafter, a method for manufacturing the conductive polymer resin according to the present invention will be explained in more detail.

The polymer resin according to the present invention is manufactured by polymerization of the above-described monomers. Particularly, the monomers for forming the polymer resin are mixed with the conductive filler for imparting electroconductivity and, if desired, additional fillers and other additives are added to the resultant mixture. Then, the finally formed mixture is subjected to polymerization. It is a matter of course that a polymerization initiator, crosslinking agent, etc. may be further added to the polymer resin during the manufacture thereof.

In one embodiment, in order to facilitate dispersion of the conductive filler and initiation of the selective photopolymerization, the monomers for forming the polymer resin are prepolymerized to provide photopolymerizable polymer syrup, the conductive filler and other desired additives are added to the polymer syrup and the resultant mixture is stirred until it is homogeneous, followed by subsequent polymerization and crosslinking.

In the polymer resin according to the present invention, physical properties, particularly adhesive properties of the polymer resin can be controlled by the amount of crosslinking agent. In one exemplary embodiment, the crosslinking agent is used in an amount of about 0.05-2 parts by weight based on 100 parts by weight of the polymer component. Particular examples of the crosslinking agent that may be used include multifunctional acrylates (for example, monomer type crosslinking agents such as 1,6-hexanediol diacrylate, trimethylolpropane triacrylate, pentaerythritol triacrylate, 1,2-ethyleneglycol diacrylate and 1,12-dodecanediol acrylate), but are not limited thereto.

Additionally, during the manufacturing process of the polymer resin according to the present invention, it is possible to use a photoinitiator and to control the polymerization degree of the polymer resin depending on the amount of photoinitiator. In one embodiment, the photoinitiator is used in an amount of about 0.01-2 parts by weight based on 100 parts by weight of the polymer resin. Particular examples of the photoinitiator that may be used include 2,4,6-trimethylbenzoyldiphenyl phosphine oxide, bis(2,4,6-trimethylbenzoyl)phenyl phosphine oxide, α,α-methoxy-α-hydroxyacetophenone, 2-benzoyl-2-(dimethylamino)-1-[4-(4-morphonylphenyl)-1-butanone, 2,2-dimethoxy-2-phenylacetophenone, but are not limited thereto.

In order to manufacture the polymer resin according to the present invention, it is preferable to apply a photopolymerization method using a photoinitiator.

In one exemplary embodiment of the method for manufacturing the polymer resin according to the present invention, monomers for forming the polymer component are polymerized partially in a substantially oxygen-free atmosphere to provide syrup having a viscosity of between about 500 cps and 20,000 cps. (In Example on the viscosity of the syrup is 300 cP.) Then, the conductive filler, other additives (if desired), a crosslinking agent and photoinitiator are added thereto, and the resultant syrup is irradiated with ultraviolet rays to perform polymerization and crosslinking of the syrup in a substantially oxygen-free atmosphere.

The polymer resin according to the present invention may be formed into the shape of a sheet. More particularly, in the above-described method, the partially polymerized syrup is formed first and, if desired, a crosslinking agent and photoinitiator are added to the syrup followed by stirring. Next, the resultant mixture is applied on a release liner in the form of a sheet and irradiated with light to perform polymerization and crosslinking of the syrup, thereby forming the polymer resin. A sufficiently oxygen-free atmosphere can be obtained by placing a second liner over the coated composition before irradiating the syrup.

Figure 4A:
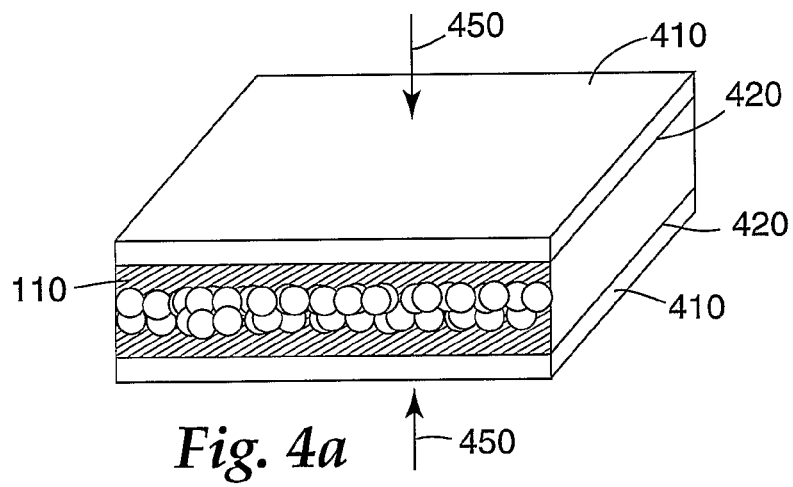
FIGS. 4a and 4b are schematic views showing how the filler undergoes a change in array under irradiation of light using unpatterned and patterned release liners.

When the monomers containing the filler or the syrup comprising partially polymerized monomers start to be polymerized from the surface upon light irradiation, the conductive filler, which is originally present at the site where polymerization is initiated, tends to move toward or be pushed to another site where polymerization is not initiated yet. In a conventional process for making a conductive polymer sheet (FIG. 4a), the polymer resin with homogeneously dispersed conductive filler (not shown) is contained between two light transmissive release liners 410. The polymer resin is exposed to light 450 from both sides. The polymerization of the polymer component 110 begins at the interface 420 between the polymer resin and the release liner 410. The conductive filler are pushed from the site where polymerization is initiated (i.e., the interface 420), toward another site where polymerization is not initiated yet (the center of the resin). This results in a concentration of the conductive particles within a narrow band within the polymer resin sheet.

To manufacture the polymer resin according to the present invention having conductive filler arrayed in both the horizontal and vertical directions to form a network structure, a patterned release liner 300 is used in the above method. Release liner 300 is made of a light transmittable material and has a desired masking pattern 310 formed on its surface (see, FIG. 3). Preferably, the release liner is disposed on both surfaces of the sheet-like polymer syrup. The masking pattern 310 may substantially reduce the light transmission through the pattern, or may prevent transmission through the pattern.

Figure 3:
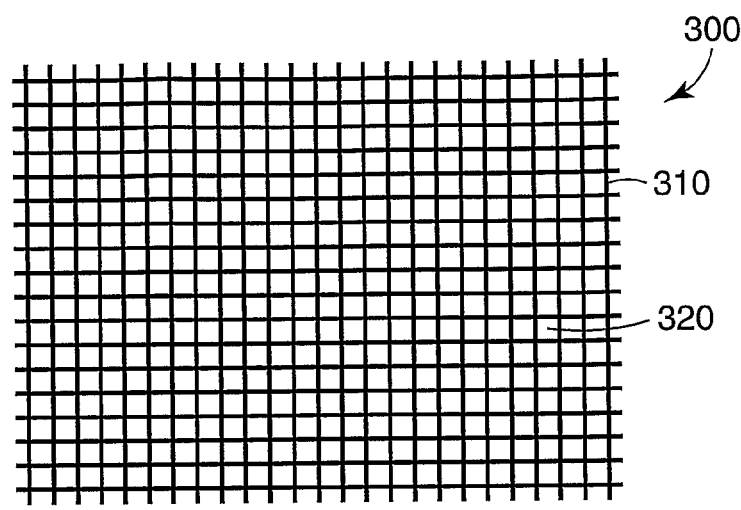
FIG. 3 is a schematic view showing one example of the pattern for a release liner according to the present invention.
Figure 4B:
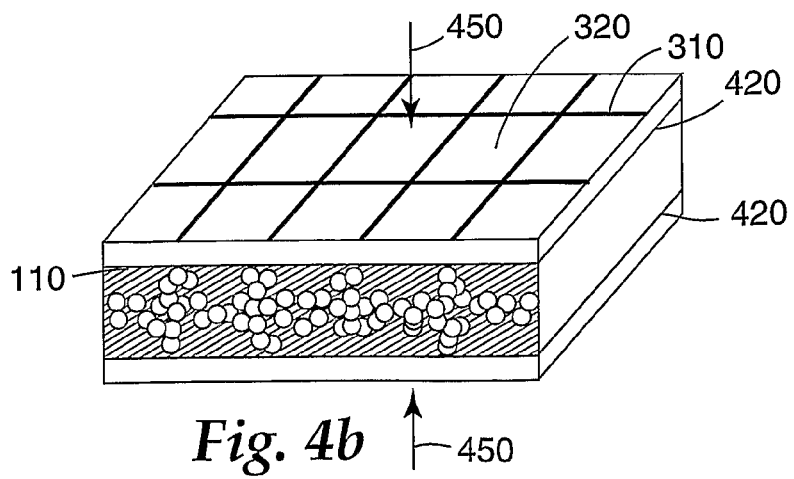

Because the light transmittable release liner 300 has a masking pattern 310 formed on its surface, light cannot transmit, or transmission is significantly reduced, through the part where the pattern is formed and photopolymerization cannot be initiated, or may be reduced or slowed, at the same part (see, FIGS. 3 and 4b). However, polymerization can occur under the pattern by a propagation reaction of radical polymerization initiated at the remaining open part 320 other than the part having the pattern. When the surface of the polymer resin or syrup is irradiated with light 450, the photopolymerization is initiated from the surface in the open part 320. If a release liner having such a masking pattern 310 is used, the photopolymerization on the surface is selectively initiated in the open parts 320 of release liner 300. The conductive filler are pushed from the site where polymerization is initiated (i.e., the interface 420 in the open parts 420), toward another site where polymerization is not initiated yet (the center of the resin and the area under the masking pattern 310 on the release liner 300). In this way, it is possible to make the conductive filler to be arrayed in the thickness direction at the part where initiation of the photopolymerization is inhibited, which provides electric conductivity along the thickness direction to the sheet-like polymer resin.

When the release liner having a pattern is disposed on either or both surfaces of the monomers or the partially polymerized syrup and then the resultant structure is subjected to photopolymerization, the polymerization reaction is initiated at the part having no pattern and the conductive filler present originally at that part moves toward inside of the structure where polymerization is not initiated yet. Meanwhile, because polymerization is not initiated under the part having a predetermined pattern, the conductive filler cannot move inwardly (see, FIG. 4b). Therefore, as shown in FIG. 2, the conductive filler is concentrated in the middle part of the sheet at the part having no pattern (when viewed from the thickness direction) and is distributed through the overall thickness at the part having a predetermined pattern, thereby forming a network as a whole, while the top surface and the bottom surface of the sheet are interconnected via the conductive filler. In other words, the conductive filler is disposed along the thickness direction (z-axis direction) at the part having a predetermined pattern, while being disposed along the horizontal direction (x-y planar direction) in the middle of the polymer resin sheet at the part other than the patterned part. Therefore, the conductive filler can form a network, as a whole, along the planar direction (x-y direction) as well as the thickness direction (z-axis direction). As a result, the polymer resin according to the present invention also has electroconductivity along its thickness direction and thus provides excellent electroconductivity compared to an adhesive resin including a conductive filler dispersed randomly in the adhesive.

There is no particular limitation in patterning form of the release liner. In one exemplary embodiment, a light-shielding part formed by the pattern comprises about 1-70% of the total area of the release liner. When the light-shielding part is present in a ratio of less than 1%, it may not be sufficient to array the conductive filler efficiently. When the light-shielding part is present in a ratio of greater than 70%, it may be difficult to perform photopolymerization effectively.

The release liner may be formed of light transmittable materials (for example, transparent plastics treated with a release agent or having low surface energy). Preferably, plastics such as a polyethylene film, polypropylene film or a polyethylene terephthalate (PET) film may be used.

Although there is no particular limitation in thickness of the release liner, in one exemplary embodiment, the release liner has a thickness of between 5 μm and 2 mm. If the thickness is less than 5 μm, the release liner may be too thin to form a pattern with ease. Moreover, it is difficult to apply polymer syrup to such thin release liners. Further, it is not advisable to provide a release liner having too large thickness, i.e., a thickness of greater than 2 mm may make the photopolymerization more difficult.

Additionally, there is no particular limitation in thickness of the sheet-like polymer resin according to the present invention. In one exemplary embodiment, the sheet-like polymer resin has a thickness of between 25 μm and 3 mm considering propagation of the photopolymerization and movability of the conductive filler. If the polymer resin sheet has a thickness of less than 25 μm, workability may become difficult due to such small thickness. If the polymer resin sheet has a thickness of greater than 3 mm, it may be more difficult to accomplish photopolymerization.

Alternatively, the coated syrup can be irradiated through an open grid in a chamber that is substantially free of oxygen, i.e., less than about 1000 ppm (parts per million) of oxygen. In some embodiments, the chamber may have less than about 500 ppm of oxygen.

Light intensity for carrying out photopolymerization according to the present invention may be one used commonly in general photopolymerization processes. In one exemplary embodiment, it is preferable to use light intensity corresponding approximately to ultraviolet rays. Meanwhile, it is also possible to determine irradiation times depending on the light intensity.

In the polymer resin according to one embodiment of the present invention, the polymer component is preferably an acrylic polymer. Generally, acrylic polymers have adhesive property and thus can be used as adhesive. Therefore, when the polymer resin is applied to electronic instruments, etc., it can provide adhesive property and conductivity without using any additional members, because the polymer itself has adhesive property. Further, the polymer resin can be formed into a roll shape and show excellent electric wave-shielding effect by virtue of good conductivity along the thickness direction as well as the planar direction. The adhesive property of acrylic resins can be controlled by adjusting degrees of polymerization and crosslinking.

Therefore, the sheet-like polymer resin (also referred to as "polymer sheet") according to the present invention can be used in polymer elastomer gaskets having impact- and vibration-absorbing properties useful for compact and middle/large sized electronic or electric instruments. In this case, the polymer sheet provides excellent electron wave-shielding effect due to its conductivity. In other words, the polymer sheet according to the present invention can protect electric or electronic instruments physically from any impact or vibration, while shielding various electric waves and electromagnetic waves generated inside/outside of the instruments at the same time, resulting in maximization of performance and functions of electronic or electric instruments.

EXAMPLES

Reference will now be made in detail to the following examples of the present invention, comparative examples and experimental examples. It is to be understood that the present invention is not limited to the following examples.

The term "part" described hereinafter means a part by weight based on 100 parts by weight of polymer component formed by polymerization of monomers.

Example 1

95 parts of 2-ethylhexylacrylate as acrylic monomer, 5 parts of acrylic acid and 0.04 parts of Irgacure-651 (α,α-methoxy-α-hydroxyacetophenone, available from Ciba Specialty Chemical, Tarrytown, N.Y.) as photoinitiator were introduced into a 1 L glass reactor. Then, the mixture was partially polymerized by light irradiation to obtain syrup having a viscosity of 300 cps. To 100 parts of the resultant syrup, 0.1 parts of Irgacure-819 [(Bis(2,4,6-trimethylbenzoyl)phenyl-phosphineoxide, available from Ciba Specialty Chemical, Tarrytown, N.Y.) as photoinitiator and 0.65 parts of 1,6-hexanediol diacrylate (HDDA) as crosslinking agent are added and the mixture was stirred thoroughly. Next, 30 parts of silver coated hollow glass spheres (SH230S33, Potters Industries Inc., Valley Forger, Pa.) having a particle diameter of about 44 μm are mixed with the mixture and then stirred thoroughly to obtain a homogeneous mixture.

Meanwhile, as shown in FIG. 3, a transparent polypropylene film having a thickness of 75 μm was patterned in the shape of a lattice with a width of 700 μm and a space of 1.5 mm by using black ink to provide a release liner.

The syrup mixture was coated on the release liner by using a roll coater to a thickness of 0.5 mm. Upon coating, the release liner is disposed on both sides of the mixture to interrupt oxygen. Then, the resultant structure was irradiated with ultraviolet rays at an intensity of 5.16 mW/cm$^2$ by using a metal halide UV lamp for 520 seconds from both sides to provide a sheet-like polymer resin (polymer sheet).

The resultant polymer sheet was an adhesive sheet having adhesive properties.

Figure 2A:
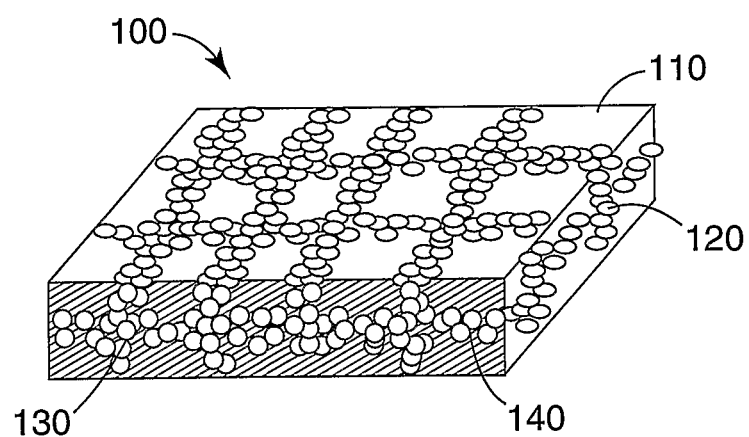
FIG. 2a is a schematic view showing the array of filler in the polymer resin according to the present invention.
Figure 2B:
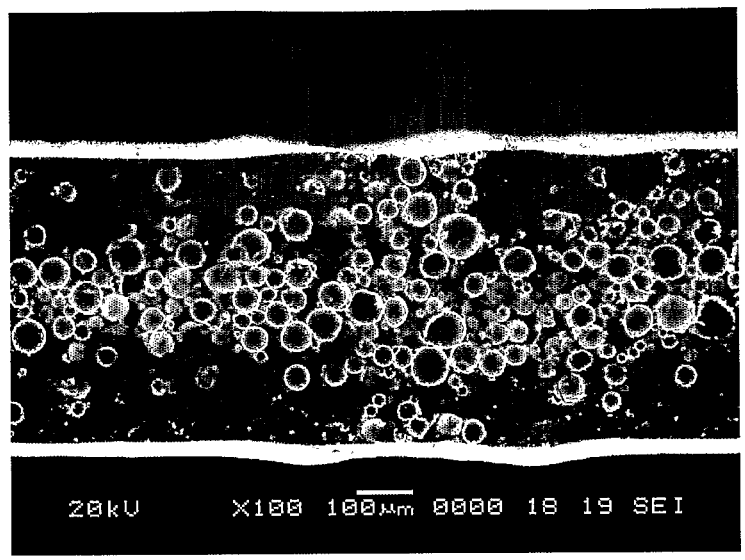
FIG. 2b is an SEM (scanning electron microscope) picture showing a cross-section of the sheet-like polymer resin according to an exemplary embodiment of the present invention.
Figure 2C:
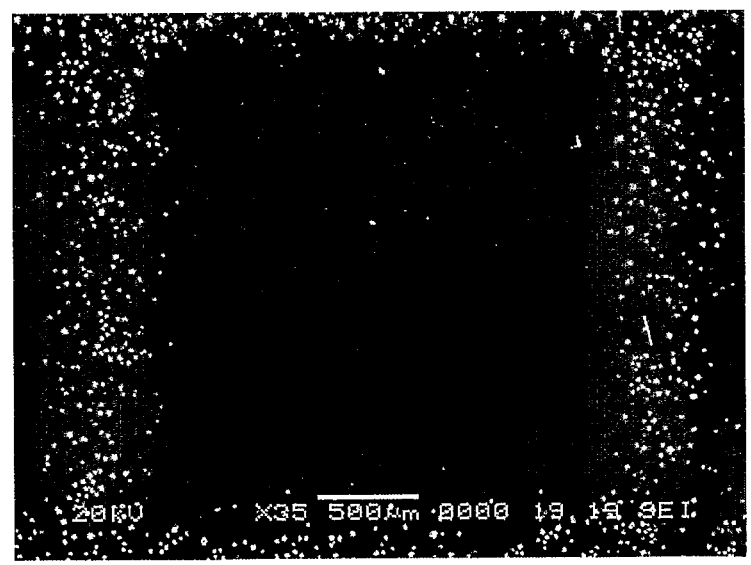
FIG. 2c is an SEM (scanning electron microscope) picture showing the surface of the sheet-like polymer resin according to an exemplary embodiment of the present invention.

To observe the distribution of the filler in the polymer sheet, the section of the polymer sheet was examined by using a scanning electron microscope (SEM) and the pictures obtained from said examination were shown in FIGS. 2b and 2c. As shown in FIGS. 2a-2c, the filler 130 is arrayed along the thickness direction (z-axis direction) at the patterned part of the sheet, while being arrayed along the horizontal direction (x-y planar direction) in the middle of the resin sheet at the non-patterned part, thereby forming a network of filler, as a whole, along the planar direction (x-y direction) as well as the thickness direction (z-axis direction).

Figure 5A:
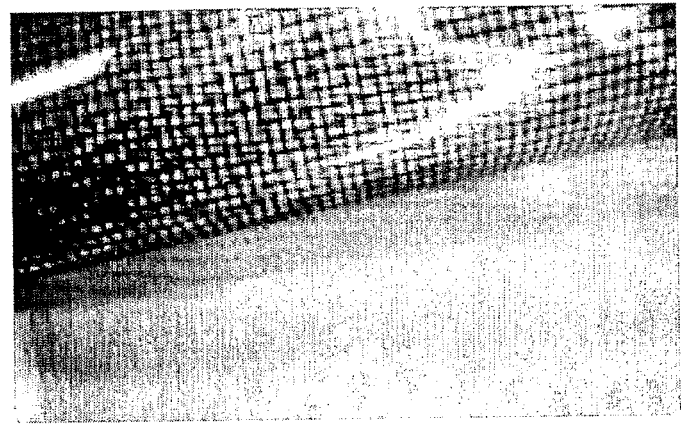
FIGS. 5a and 5b are pictures showing the sheet-like polymer resin according to the present invention, from which a release liner is being removed (FIG. 5a), and the sheet-like polymer resin according to the present invention after removing a release liner therefrom (FIG. 5b).
Figure 5B:
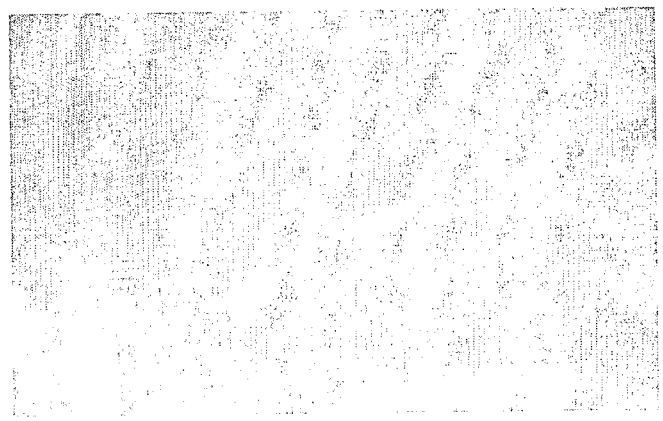

FIG. 1 shows the appearance of the sheet according to this example and FIG. 5a is a picture showing the same sheet, from which a release liner is being removed.

Example 2

Example 1 was repeated to provide a polymer sheet, except that 60 parts by weight of nickel coated graphite fibers available from Sulzer Metco Inc., Winterthur, Switzerland, were used as conductive filler.

Comparative Examples 1 and 2

Examples 1 and 2 were repeated to provide polymer resin sheets of Comparative Examples 1 and 2, except that the release liner was not patterned in both cases.

Experimental Example 1

Measurement of Resistance

Each of the polymer resin sheets obtained from Examples 1 and 2 and Comparative Examples 1 and 2 was measured for volume resistance by using Kiethely 580 micro-ohmmeter on the basis of the Surface Probe Mode according to MIL-G-83528B (Standard). The results are shown in the following Table 1.

Experimental Example 2

Adhesion Test

Each of the adhesive sheets obtained from the above Examples and Comparative Examples. Strips of the adhesive were cut. The first release liner is removed and the adhesive is laminated to a strip of aluminum foil. The second release liner is removed and laminated to a piece of steel. After lamination to steel, each sheet was left for at least 30 minutes at a temperature of 25° C. and 100° C. The adhesion force was measured for 90°-peel adhesion force to steel. The results are shown in the following Table 1.

TABLE 1

|  |  | Ex. 1 | Ex. 2 | Comp. Ex. 1 | Comp. Ex. 2 |
|---|---|---|---|---|---|
| Volume Resistance (Ohm · square) |  | 0.02 | 0.07 | Non-available | Non-available |
| Adhesion (gf/in) | 25° C. | 1065 | 975 | 1219 | 991 |
|  | 100° C. | 2457 | 2111 | 2643 | 2313 |

As can be seen from Table 1, the polymer sheets of Examples 1 and 2 according to the present invention can provide conductivity while showing an adhesion force equivalent or similar to that of the sheets according to Comparative Examples 1 and 2. Particularly, the polymer sheets according to Comparative Examples 1 and 2 provide such an extremely large resistance that exceed measurable ranges. On the contrary, the polymer sheets according to Examples 1 and 2 provide a significantly decreased resistance.

As can be seen from the foregoing, the polymer sheet according to the present invention comprises a conductivity filler arrayed along the thickness direction as well as horizontal direction and thus shows conductivity along the thickness direction. Therefore, the polymer sheet according to the present invention has a electromagnetic wave-shielding effect as well as impact- and vibration-absorbing properties, and thus can protect electronic devices inside of electronic instruments when used as gaskets for packing electronic instruments.

While this invention has been described in connection with the exemplary embodiments discussed above, it is to be understood that the invention is not limited to the disclosed embodiment and the drawings. On the contrary, it is intended to cover various modifications and variations within the spirit and scope of the appended claims.

The invention claimed is:

1. A method for manufacturing a polymer resin sheet comprising:
   (a) forming a polymer syrup by partial polymerization of monomers;
   (b) adding conductive filler particles to the polymer syrup and mixing them;
   (c) applying a release liner having a desired pattern of light transmissive and light shielding areas onto a surface of the syrup containing the conductive filler particles added thereto; and
   (d) irradiating the polymer syrup surface with light through the release liner to photopolymerize the areas of polymer syrup beneath the light transmissive areas of the release liner,
   whereby the polymerization of the polymer syrup beneath the light transmissive areas of the release liner causes the conductive filler particles to move toward the unpolymerized areas of the polymer syrup,
   thereby forming the polymer resin sheet, in which the conductive filler particles form a conductive network comprising a first section providing a conductive path from one major surface of the polymer resin sheet to another major surface of the polymer resin sheet and a second section providing a conductive path along a length and width of polymer the resin sheet.

2. The method according to claim 1 wherein the polymer syrup has a viscosity of between about 500 cps and about 20,000 cps.

3. The method according to claim 1 wherein the pattern formed on the release liner provides a light-shielding area corresponding to between about 1 and about 70 percent of the total area of the release liner.

4. The method according to claim 1 wherein the polymer or polymer component comprises or is made to comprise an acrylic polymer.

5. The resin or method according to claim 4 wherein the acrylic polymer is a copolymer of a polar copolymerizable monomer with an alkyl acrylate monomer whose alkyl group has 1-14 carbon atoms.

6. The resin or method according to claim 5 wherein the alkyl acrylate monomer is selected from the group consisting of butyl(meth)acrylate, hexyl(meth)acrylate, n-octyl(meth)acrylate, isooctyl(meth)acrylate, 2-ethylhexyl(meth)acrylate, isononyl(meth)acrylate, isooctyl acrylate, isononyl acrylate, 2-ethylhexyl acrylate, decyl acrylate, dodecyl acrylate, n-butyl acrylate and hexyl acrylate and wherein the polar copolymerizable monomer is selected from the group consisting of acrylic acid, itaconic acid, hydroxyalkyl acrylates, cyanoalkyl acrylates, acrylamides, substituted acrylamides, N-vinyl pyrrolidone, N-vinyl caprolactam, acrylonitrile, vinyl chloride and diallyl phthalate.

7. The method according to claim 1 wherein the polymer syrup has two major surfaces, wherein the patterned release liner is applied to each major surface, and wherein the polymer syrup is irradiated through both release liners.

* * * * *

UNITED STATES PATENT AND TRADEMARK OFFICE
CERTIFICATE OF CORRECTION

| | |
|---|---|
| PATENT NO. | : 8,975,004 B2 |
| APPLICATION NO. | : 11/913690 |
| DATED | : March 10, 2015 |
| INVENTOR(S) | : Choi et al. |

Page 1 of 1

It is certified that error appears in the above-identified patent and that said Letters Patent is hereby corrected as shown below:

Title Page, item (75)

<u>Column 1, First Page (Inventors)</u>

Line 2, delete "Gyongki-Do" and insert -- Gyeonggi-Do --, therefor.

<u>Column 1, First Page (Inventors)</u>

Line 3, delete "Hwasong" and insert -- Hwaseong --, therefor.

In the Specification

<u>Column 4</u>

Line 61, delete "than a the" and insert -- than the --, therefor.

<u>Column 7</u>

Line 32, delete "morphonylphenyl)" and insert -- morpholinylphenyl) --, therefor.

<u>Column 10</u>

Line 37 (Approx.), delete "Forger," and insert -- Forge, --, therefor.

Signed and Sealed this
Sixteenth Day of February, 2016

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,975,004 B2 | Page 1 of 1 |
| APPLICATION NO. | : 11/913690 | |
| DATED | : March 10, 2015 | |
| INVENTOR(S) | : Jeongwan Choi et al. | |

It is certified that error appears in the above-identified patent and that said Letters Patent is hereby corrected as shown below:

"Title Page, item (75)

Column 1, First Page (Inventors)

Line 2, delete "Gyongki-Do" and insert -- Gyeonggi-Do --, therefor.

Column 1, First Page (Inventors)

Line 3, delete "Hwasong" and insert -- Hwaseong --, therefor."

(as corrected to read in the Certificate of Correction issued February 16, 2016) is deleted and patent is returned to its original state with the Inventors name in patent to read
--Jeongwan Choi, Suwon-Si (KR);
Un Nyoung Sa, Gyongki-Do (KR);
Won-Sik Kim, Hwasong (KR)--

Signed and Sealed this
Thirty-first Day of May, 2016

Michelle K. Lee
*Director of the United States Patent and Trademark Office*